(12) United States Patent
Sano et al.

(10) Patent No.: US 11,860,235 B2
(45) Date of Patent: Jan. 2, 2024

(54) BATTERY STATE ESTIMATION APPARATUS

(71) Applicant: DENSO CORPORATION, Kariya (JP)

(72) Inventors: Yuri Sano, Kariya (JP); Hiroki Fujii, Kariya (JP); Koji Ohira, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/693,679

(22) Filed: Mar. 14, 2022

(65) Prior Publication Data

US 2022/0196750 A1 Jun. 23, 2022

Related U.S. Application Data

(63) Continuation of application No. PCT/JP2020/031191, filed on Aug. 19, 2020.

(30) Foreign Application Priority Data

Sep. 30, 2019 (JP) .................... 2019-179279

(51) Int. Cl.
*G01R 31/389* (2019.01)
*G01R 31/3842* (2019.01)
(Continued)

(52) U.S. Cl.
CPC ....... *G01R 31/389* (2019.01); *G01R 31/3648* (2013.01); *G01R 31/374* (2019.01); *G01R 31/3842* (2019.01)

(58) Field of Classification Search
CPC ............................ G01R 31/389; G01R 31/3842
(Continued)

(56) References Cited

U.S. PATENT DOCUMENTS 10,641,836 B1 * 5/2020 Hou .................... G01R 31/392
2008/0204031 A1 8/2008 Iwane et al.
(Continued)

FOREIGN PATENT DOCUMENTS

GB 2461350 A 1/2010
JP 2007108063 A 4/2007
(Continued)

*Primary Examiner* — Ricky Go
(74) *Attorney, Agent, or Firm* — Harness, Dickey & Pierce, P.L.C.

(57) ABSTRACT

A battery state estimation apparatus calculates a measured DC resistance value of a DC resistance based on a current change amount and a voltage change amount, which are calculated in a predetermined period using measured current value and voltage value. The battery state estimation apparatus further calculates (i) a non-temperature dependent constant and (ii) a constant of a temperature dependent function based on (i) an estimated DC resistance value and (ii) the measured DC resistance value. The estimated DC resistance value is an estimated value of the measured DC resistance value; the estimated DC resistance value is represented as a sum of (i) the non-temperature dependent constant Ra, which indicates a temperature independent component of the DC resistance of the secondary battery, and (ii) the temperature dependent function Rb, which indicates a temperature dependent component of the DC resistance of the secondary battery.

6 Claims, 5 Drawing Sheets

(51) Int. Cl.
*G01R 31/374* (2019.01)
*G01R 31/36* (2020.01)

(58) Field of Classification Search
USPC .......................................................... 702/63
See application file for complete search history.

(56) References Cited

U.S. PATENT DOCUMENTS

| | | | |
|---|---|---|---|
| 2010/0045298 A1 | 2/2010 | Iwane et al. | |
| 2012/0265462 A1 | 10/2012 | Iwane et al. | |
| 2013/0116954 A1* | 5/2013 | Tazoe | G06F 17/00 |
| | | | 702/63 |
| 2013/0154577 A1* | 6/2013 | Iwane | H02J 7/0049 |
| | | | 320/162 |
| 2016/0375790 A1 | 12/2016 | Komiyama | |
| 2019/0064283 A1* | 2/2019 | Laurent | G01R 31/396 |
| 2019/0198938 A1* | 6/2019 | Fujita | H02J 7/0029 |

FOREIGN PATENT DOCUMENTS

| | | |
|---|---|---|
| JP | 2009021025 A | 1/2009 |
| JP | 2010175484 A | 8/2010 |
| JP | 2017009540 A | 1/2017 |
| WO | WO-2017056732 A1 | 4/2017 |

\* cited by examiner

BATTERY STATE ESTIMATION APPARATUS

CROSS REFERENCE TO RELATED APPLICATIONS

The present application is a continuation application of International Patent Application No. PCT/JP2020/031191 filed on Aug. 19, 2020, which designated the U.S. and claims the benefit of priority from Japanese Patent Application No. 2019-179279 filed on Sep. 30, 2019. The entire disclosures of all of the above applications are incorporated herein by reference.

TECHNICAL FIELD

The present disclosure relates to a battery state estimation apparatus.

BACKGROUND

A secondary battery deteriorates with use; the internal resistance value thus fluctuates. For example, there is disclosed a method of estimating the DC resistance value of a deteriorated secondary battery. This method for estimating the DC resistance value of the secondary battery uses a temperature coefficient that has a temperature dependence according to the Arrhenius equation, to correct the resistance value from the value of the secondary battery in the initial state. The DC resistance value of the deteriorated secondary battery is thereby estimated.

SUMMARY

According to an example of the present disclosure, a battery state estimation apparatus is provided to calculate a measured DC resistance value of a DC resistance based on a current change amount and a voltage change amount, which are calculated in a predetermined period using measured current value and voltage value. The battery state estimation apparatus is further provided to calculate a non-temperature dependent constant and a constant of a temperature dependent function based on (i) an estimated DC resistance value and (ii) the measured DC resistance value. The estimated DC resistance value is an estimated value of the measured DC resistance value; the estimated DC resistance value is represented as a sum of (i) the non-temperature dependent constant Ra, which indicates a temperature independent component of the DC resistance of the secondary battery, and (ii) the temperature dependent function Rb, which indicates a temperature dependent component of the DC resistance of the secondary battery.

BRIEF DESCRIPTION OF DRAWINGS

The objects, features, and advantages of the present disclosure will become more apparent from the following detailed description made with reference to the accompanying drawings. In the drawings.

DETAILED DESCRIPTION

First Embodiment

Figure 1:
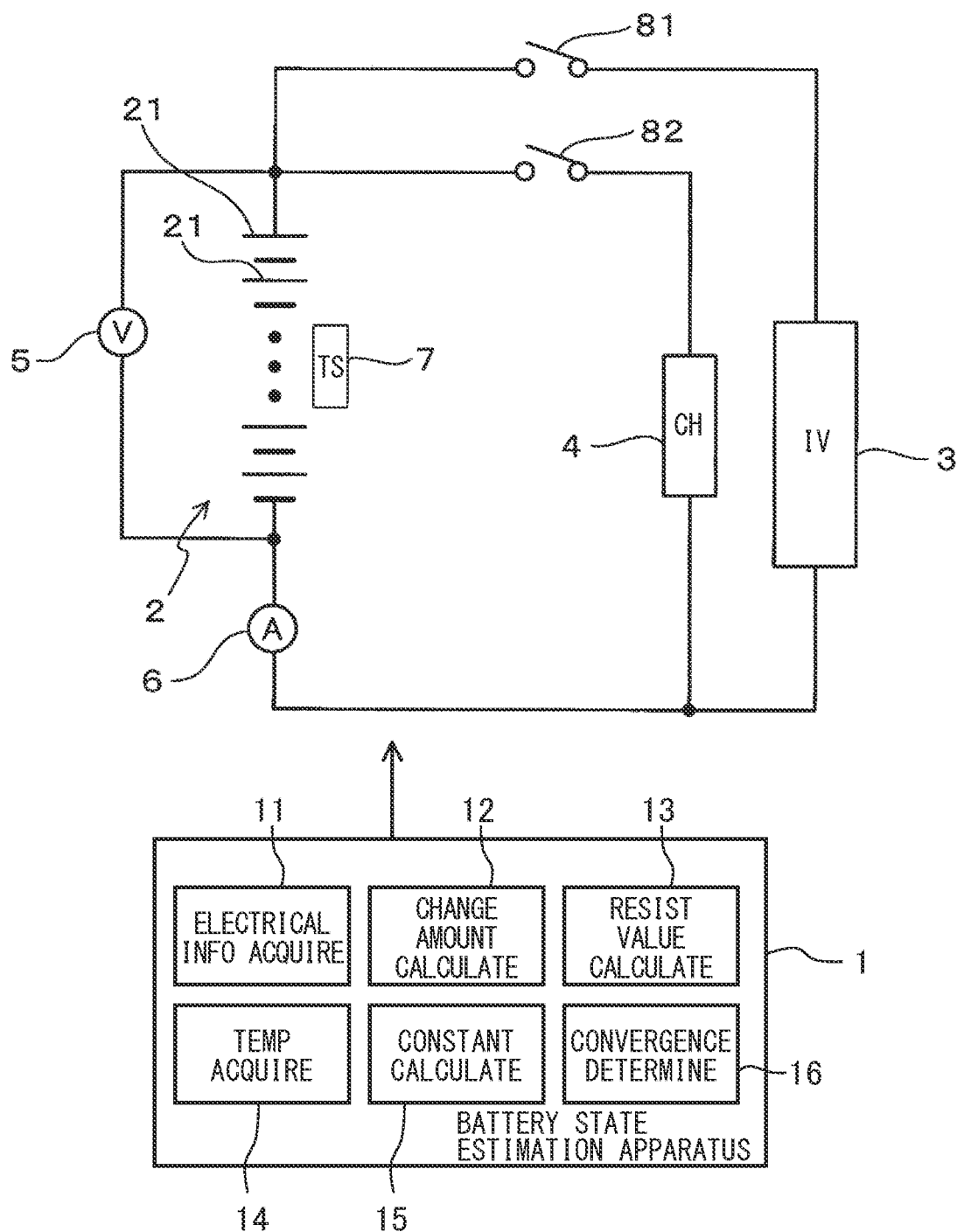
FIG. 1 is a conceptual diagram of a battery state estimation apparatus and a power supply system including the battery state estimation apparatus according to a first embodiment.

An embodiment of the battery state estimation apparatus will be described with reference to FIGS. 1 to 5. As shown in FIG. 1, a battery state estimation apparatus 1 according to the present embodiment includes an electrical information acquisition unit 11, a change amount calculation unit 12, a resistance value calculation unit 13, a temperature acquisition unit 14, a constant calculation unit 15, and a convergence determination unit 16.

The electrical information acquisition unit 11 acquires a current value and a voltage value of a secondary battery 2 by measurement. The change amount calculation unit 12 calculates a current change amount $\Delta I$ and a voltage change amount $\Delta V$ of the secondary battery 2 in a predetermined period by using the current values and the voltage values acquired by the electric information acquisition unit 11. The resistance value calculation unit 13 calculates a measured DC resistance value based on the current change amount $\Delta I$ and the voltage change amount $\Delta V$. The temperature acquisition unit 14 acquires the temperature of the secondary battery 2.

The constant calculation unit 15 calculates (i) a non-temperature dependent constant Ra and (ii) a constant of a temperature dependent function Rb ("A" described later), based on (i) the estimated DC resistance value Rdc' represented by the sum of the non-temperature dependent constant Ra and the temperature dependent function Rb and (ii) the measured DC resistance value Rdc acquired by the resistance value calculation unit 13. The non-temperature dependent constant Ra is a temperature-independent component of the DC resistance of the secondary battery 2. The temperature dependent function Rb is a function that depends on the temperature in the DC resistance of the secondary battery 2.

The convergence determination unit 16 includes a function of determining whether or not the value calculated by the constant calculation unit 15 has converged, although the details will be described later.

Hereinafter, the present embodiment will be described in detail.

The battery state estimation apparatus 1 according to the present embodiment is used by being mounted on a vehicle such as an electric vehicle or a hybrid vehicle, together with the secondary battery 2. The battery state estimation apparatus 1 may be incorporated in, for example, an engine ECU (electronic control unit).

It is noted that the engine ECU, the battery state estimation apparatus 1 in the engine ECU, and the units 11 to 16 in the battery state estimation apparatus 1 and methods thereof may be implemented by one or more special-purpose computers. Such computers may be created (i) by configuring (a) a memory and a processor programmed to execute one or more particular functions embodied in computer programs, or (ii) by configuring (b) a processor provided by one or more special purpose hardware logic circuits, or (iii) by configuring a combination of (a) a memory and a processor programmed to execute one or more particular functions embodied in computer programs and (b) a processor provided by one or more special purpose hardware logic circuits.

The computer programs may be stored, as instructions being executed by a computer, in a tangible non-transitory computer-readable storage medium.

As shown in FIG. 1, the secondary battery 2 is connected to an inverter 3 and a charging device 4. The inverter 3 converts the DC power supplied from the secondary battery 2 into AC power and outputs the AC power to a three-phase AC motor (not shown).

The secondary battery 2 includes a plurality of battery cells 21 connected in series with each other. Each battery cell 21 consists of, for example, a lithium-ion secondary battery. The positive electrode of the secondary battery 2 is made of a lithium transition metal oxide such as LiFePO4. In addition, the negative electrode of the secondary battery 2 is made of a negative electrode active substance that can occlude and release lithium ions such as graphite. The secondary battery 2 may be configured by connecting a plurality of battery cells 21 in parallel to each other to form a cell block, and connecting a plurality of these cell blocks in series to each other.

A voltage sensor 5 and a current sensor 6 are connected to the secondary battery 2. Information on the voltage sensor 5 and information on the current sensor 6 are transmitted to the electrical information acquisition unit 11. In addition, a temperature sensor 7 for measuring the temperature of the secondary battery 2 is arranged in the vicinity of the secondary battery 2. Information on the temperature sensor 7 is transmitted to the temperature acquisition unit 14.

As mentioned above, the secondary battery 2 is connected to the inverter 3 and the charging device 4. A discharge switch 81 is provided between the secondary battery 2 and the inverter 3. In addition, a charging switch 82 is provided between the secondary battery 2 and the charging device 4. When the power is supplied from the secondary battery 2 to the inverter 3, the discharge switch 81 is turned on. Also, when the secondary battery 2 is charged, the charging switch 82 is turned on. The on-off operation of the charging switch 82 and the discharging switch 81 is controlled by the ECU.

Next, the method of estimating the DC resistance value of the deteriorated secondary battery 2 will be explained.

The DC resistance of the secondary battery 2 is theoretically expressed by the sum of the non-temperature dependent constant Ra and the temperature dependent function Rb. Specifically, the DC resistance of the secondary battery 2 is expressed by the following expression.

[Expression (1)]

$$R'_{dc}(t) = R_a + R_b(t) \quad (1)$$
$$= R_a + A \times \exp\left(\frac{B}{T(t)}\right)$$

Figure 2:
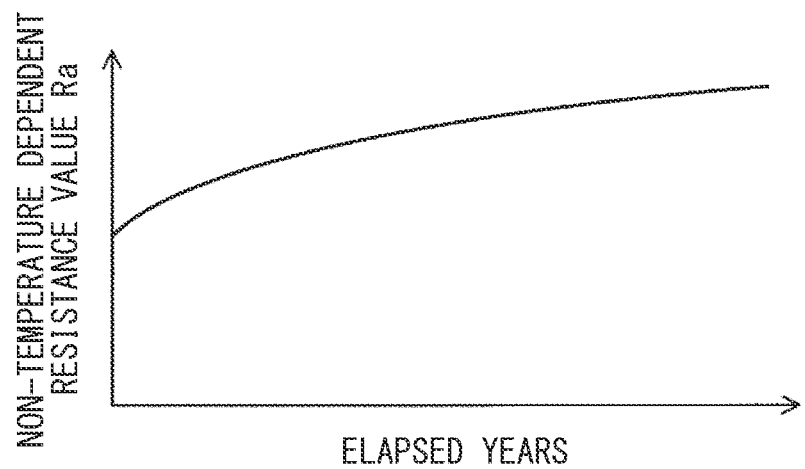
FIG. 2 is a graph schematically showing the relationship between the elapsed years and the non-temperature dependent constant Ra according to the first embodiment.

Here, the (') symbol means that it is estimated, not measured. The non-temperature dependent constant Ra in the above Expression (1) is a resistance of the secondary battery 2 that does not depend on temperature. The non-temperature dependent constant Ra includes non-temperature dependent resistors such as metal conductor resistance and bus bar contact resistance. The non-temperature dependent constant Ra increases with deterioration of the secondary battery 2 (increase in the elapsed years), for example, as schematically shown in FIG. 2.

Figure 3:
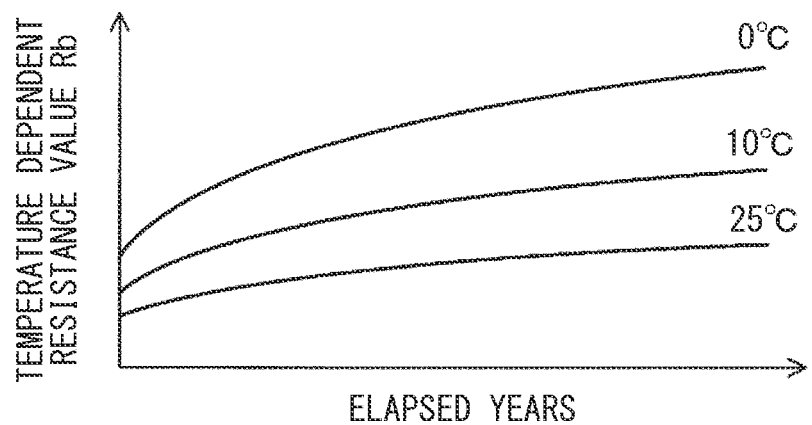
FIG. 3 is a graph schematically showing the relationship between the elapsed years and the temperature dependent function Rb according to the first embodiment.

The temperature dependent function Rb in the above Expression (1) is a DC resistance component expressed according to the Arrhenius equation, and depends on the temperature of the secondary battery 2 as shown in FIG. 3. FIG. 3 schematically shows the transition of the temperature dependent function Rb at 0 degree C., 10 degrees C., and 25 degree C. Here, "A" in the temperature dependent function Rb is a constant in the temperature dependent function Rb, and its value increases as the secondary battery 2 deteriorates. Further, "B" in the temperature dependent function Rb is an eigenvalue determined by the materials that are included in the secondary battery 2. Also, "T" in the temperature dependent function Rb is an absolute temperature of the secondary battery 2, and it depends on the time t.

Figure 4:
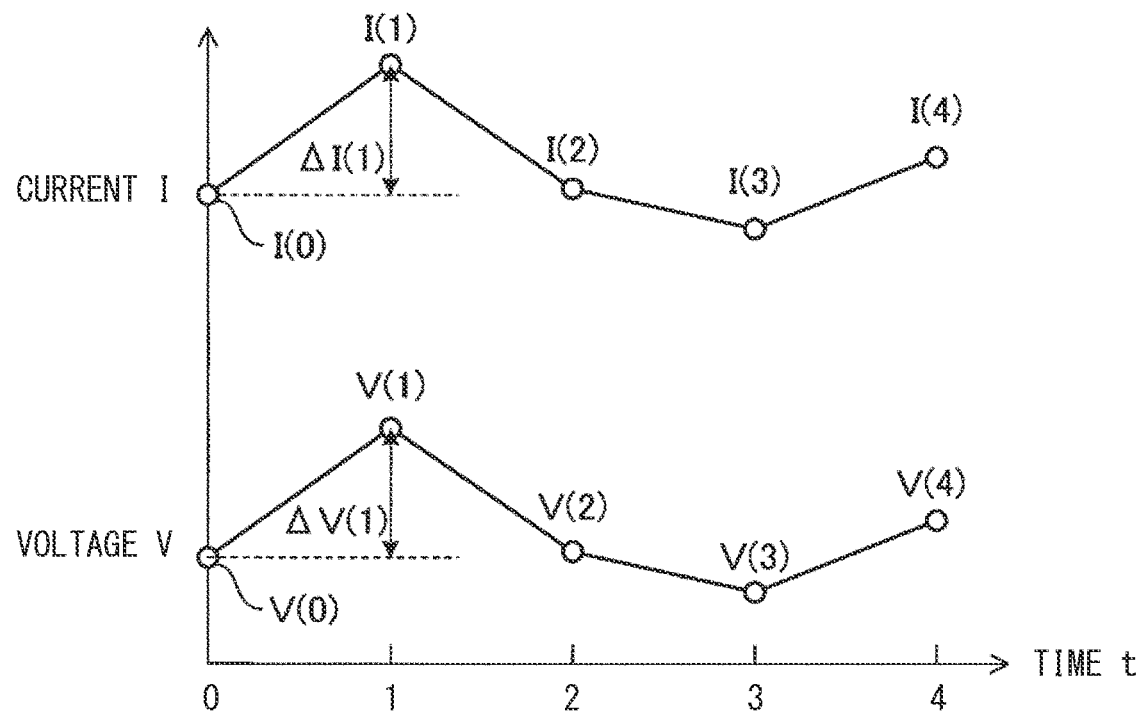
FIG. 4 is a schematic graph for explaining the current change amount $\Delta I$ and the voltage change amount $\Delta V$ according to the first embodiment.

Here, as shown in FIG. 4, the measured value of the DC resistance of the secondary battery 2 can be expressed by the following Expression by the change ΔI of the current value in the measured specific period and the change ΔV of the voltage value in the specific period.

[Expression (2)]

$$R_{dc}(t) = \frac{\Delta V(t)}{\Delta I(t)} \quad (2)$$

Here, ΔV(t) is expressed by ΔV(t)=V(t)−V(t−1). V(t−1) means the voltage value of the secondary battery 2 at the time t−1 when the voltage value was acquired immediately before V(t). Also, ΔI(t) is expressed by ΔI(t)=I(t)−I(t−1). I(t−1) means the voltage value of the secondary battery 2 at the time t−1 when the current value was acquired immediately before I(t). The resistance value calculation unit 13 calculates the measured DC resistance value Rdc(t) using the measured values of the current value and the voltage value of the secondary battery 2 acquired by the electrical information acquisition unit 11. That is, in calculating the measured DC resistance value Rdc(t), for example, the measured current value and the measured voltage value are used, instead of the current value and voltage value of the secondary battery 2 after the averaging process. Then the constant calculation unit 15 calculates (i) the non-temperature dependent constant Ra and (ii) the constant A of the temperature dependent function Rb, in the estimated DC resistance value Rdc', such that the cumulative error between the estimated DC resistance value Rdc' expressed using (i) the measured value of the temperature of the secondary battery 2 and (ii) the measured DC resistance value Rdc is less than or equal to a predetermined value. Such a method for calculating these constants Ra and A may use a sequential least squares method, a least squares method, a Kalman filter, etc.

Figure 5:
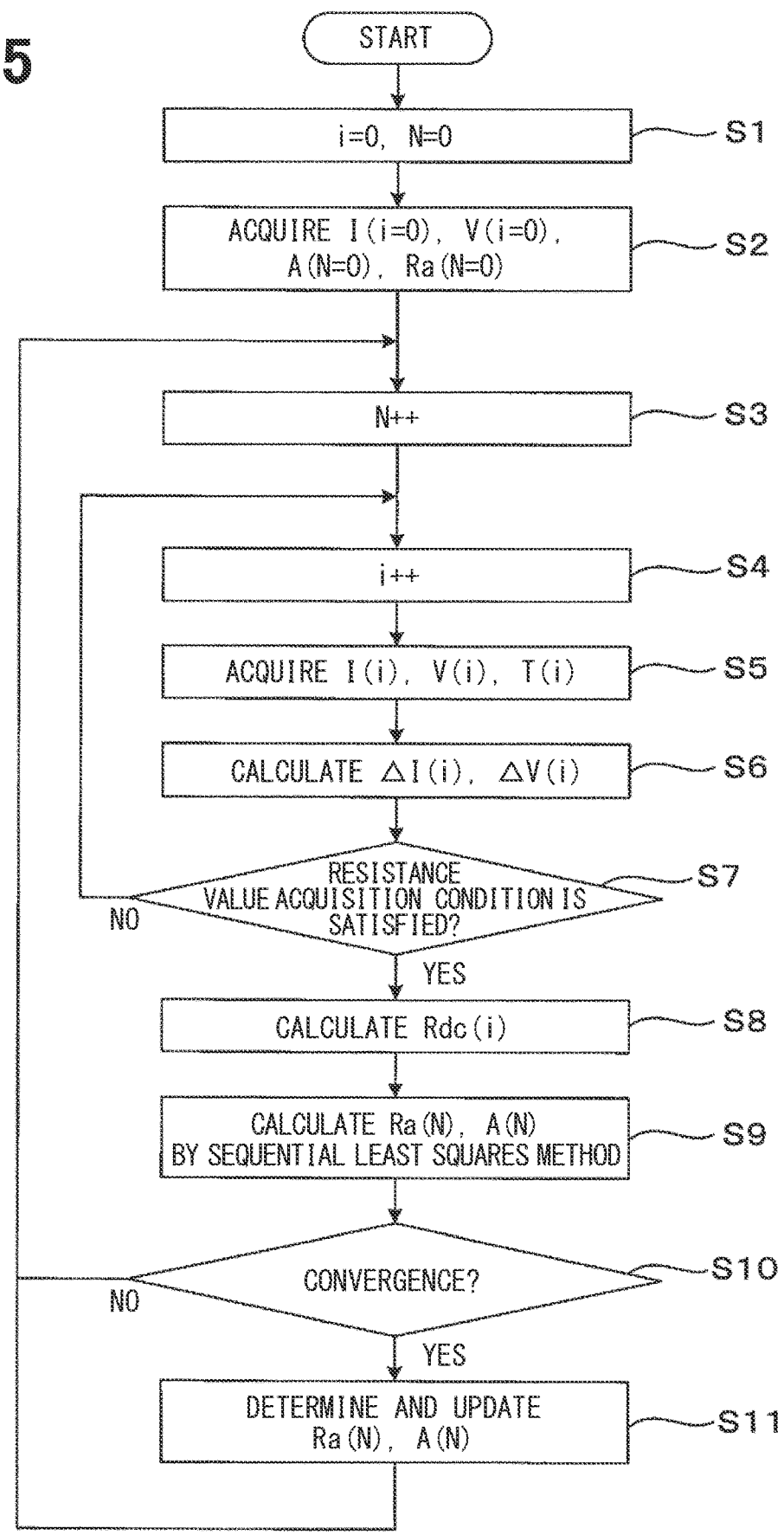
FIG. 5 is a flowchart for explaining a process performed by the battery state estimation apparatus according to the first embodiment.

Next, the process of estimating the constants Ra and A by the battery state estimation apparatus 1 will be described with reference to the flowchart shown in FIG. 5.

In step S1, the battery state estimation apparatus 1 sets i corresponding to the time axis to 0 (zero) and sets N corresponding to the number of calculations of A and Ra to 0 (zero). Then, in step S2, the current value I(0) and the voltage value V(0), which are initial values of the current value I(i) and the voltage value V(i), are acquired by the measurement by the current sensor 6 and the voltage sensor 5. The measurement by the current sensor 6 and the voltage sensor 5 is performed repeatedly at regular time intervals. Furthermore, A(0) and Ra(0), which are initial values of A(N) and Ra(N), are acquired. Here, A(0) and Ra(0) may be values of A and Ra that were updated during the previous run. Suppose a case where there are none of values of A and Ra that were updated during the previous run (for example, when the system is started). Such a case employs, as A(0) and Ra(0), the values of A and Ra that are calculated in advance using the second battery before deterioration of the same type as the secondary battery 2 using the battery state estimation apparatus 1.

Next, in step S3, N is increased by one (1). Also, in step S4, i is increased by one (1). In step S5, the current value I(1), voltage value V(1), and temperature T(1) are acquired. Here, the current value I(1), voltage value V(1), and temperature T(1) are acquired in the measurement timing (that is, the timing of i=1) following the measurement timing of the current value I(0) and the voltage value V(0) (that is, the timing of step S2).

Then, in step S6, $\Delta I(i)$ and $\Delta V(i)$ are calculated. As described above, $\Delta I(i)$ is the value obtained by subtracting the value of the current value I(i-1) acquired at the previous time from the current value I(i) acquired at the present time point. That is, $\Delta I(i)=I(i)-I(i-1)$. $\Delta V(i)$ is the value obtained by subtracting the value of the voltage value V(i-1) acquired at the previous time from the voltage value V(i) acquired at the present time point. That is, $\Delta V(i)=V(i)-V(i-1)$.

Next, in step S7, it is determined whether or not the resistance value acquisition condition is satisfied. In the present embodiment, the resistance value acquisition condition means a condition in which both the following Expressions (3) and (4) are satisfied.

[Expression (3) and (4)]

$$|\Delta I(t)| \geq j \quad (3)$$

$$\frac{|\Delta I(t)|}{I(t)} \geq l \quad (4)$$

In addition, j in the above Expression (3) and I in the Expression (4) are predetermined conforming values. By satisfying both Expressions (3) and (4), the measured DC resistance value Rdc(i) can be obtained with high accuracy. When at least one of Expressions (3) and (4) is not satisfied, steps S4 to S7 are repeated. Then, when it is determined in step S7 that both Expressions (3) and (4) are satisfied, the process proceeds to the next step S8.

Next, in step S8, the measured DC resistance value $Rdc(i)=\Delta V(i)/\Delta I(i)$ is calculated from $\Delta I(i)$ and $\Delta V(i)$ calculated in step S6 (the above Expression (2)).

Next, in step S9, the constants Ra(N) and A(N) are obtained by the sequential least squares method based on exp(B/T(i)), Ra(N−1), and A(N−1). Here, exp(B/T(i)) is expressed using the measured DC resistance value Rdc(i) obtained in step S8 and T(i) obtained in step S5. Ra(N-1) and A(N-1) are the previously estimated values of Ra and A respectively.

The sequential least squares method identifies the parameters as follows. First, the measured DC resistance value Rdc (see Expression (2)) and the estimated DC resistance value Rdc'(see Expression (1)) are set as follows.

[Expression (5) and (6)]

$$y(k) = R_{dc}(k) = z^T(k) \cdot \theta(k) \quad (5)$$

$$z(k) = \begin{bmatrix} \exp\left(\frac{B}{T(k)}\right) \\ 1 \end{bmatrix}, \theta(k) = \begin{bmatrix} A(k) \\ R_a(k) \end{bmatrix} \quad (6)$$

Here, the subscript "T" means the transposed matrix. Further, as described above, B in the Expression (6) is an eigenvalue determined by the materials included in the secondary battery 2. T is an absolute temperature of the secondary battery 2, and obtained from the temperature sensor 7. Therefore, the constants in Expression (5) and (6) are Ra(k) and A(k) in θ(k). The identification of Ra(k) and A(k) is performed by the following Expression (7) expressing the algorithm of the sequential least squares method. As the sequential least squares method, for example, a commonly used method can be adopted.

$$\theta'(k) = \theta'(k-1) + L(k)\epsilon(k) \quad \text{[Expression (7)]}$$

$$\epsilon(k) = y(k) - \Phi^T(k)\theta'(k-1)$$

$$L(k) = \frac{P(k-1)\psi(k)}{\rho(k) + \Phi^T(k)P(k-1)\psi(k)}$$

$$P(k) = \frac{1}{\rho(k)}\left[P(k-1) - \frac{P(k-1)\psi(k)\Phi^T(k)P(k-1)}{\rho(k) + \Phi^T(k)P(k-1)\psi(k)}\right]$$

$$\Phi(k) = z(k)$$

$$\psi(k) = z(k)$$

Here, P is a covariance matrix of 2×2 matrix, and L is 2×1 matrix. ρ(k) is a forgetting coefficient, and ρ(k) satisfies 0<ρ≤1. In the present embodiment, ρ(k) is appropriately determined so as to weaken the influence of the past data and strengthen the influence of the data in the vicinity of the present. As a result, the constant calculation unit 15 calculates the current Ra and A by weighting the past constants Ra and A according to the period (i.e., the time difference) from the present time point (k). With such an algorithm, Ra(N) and A(N) are calculated using Rdc(i), exp(B/T(i)), Ra(N-1), and A(N-1).

Next, in step S10, a convergence determination is performed. The convergence determination determines that the respective values of Ra and A have converged when both the following first condition and second condition are satisfied. In contrast, when at least one of the first condition and the second condition is not satisfied, it is determined that the respective values of Ra and A have not converged. First condition: The number of calculations for Ra and A is equal to or greater than a specified number (for example, 3 times). Second condition: (i) The slope of the approximate straight line obtained from the plot obtained from (i) Ra(k-n), . . . , Ra(k-1), Ra(k), which are calculated or obtained at corresponding time points up to the present time point, on Y axis and (ii) the time (i.e., the corresponding time points up to the present time point) on X axis is equal to or less than a threshold value, and (ii) the slope of the approximate straight line obtained from the plot obtained from (i) A(k-n), . . . , A(k-1), which are calculated or obtained at corresponding time points up to the present time point, A(k) on Y axis, and (ii) the time (i.e., the corresponding time points up to the present time point) on X axis is equal to or less than a threshold value. Here, n is a natural number less than or equal to k, and determines how many past data needed to be considered in the convergence determination by going backward in time from the present time point (k). As a result, the constant calculation unit 15 calculates Ra(N) and A(N), based on the measured DC resistance values, which are acquired by the resistance value calculation unit 13 during the measurement period, which is a predetermined period from the start time point (k-n) to the present time point (k).

When at least one of the first condition and the second condition is not satisfied, the process returns to step S3 while retaining the logs of Ra(N) and A(N) acquired in step S9. In contrast, when both the first condition and the second condition are satisfied, it is determined that the values of Ra(N) and A(N) have converged, and Ra(N) and A(N) are determined.

Then, the next estimation of Ra and A is realized by performing the process from step S3 while retaining the previous logs of Ra and A. Then, in step S11, the values of Ra(N) and A(N) are updated sequentially.

From the above, the present embodiment makes it possible to separately estimate the DC resistance component that does not depend on temperature and the DC resistance component that depends on temperature from the measured values of the current, voltage, and temperature in the actual patterns. It is thus possible to estimate the onboard deterioration of the DC resistance of the secondary battery 2 with high accuracy.

The present embodiment provides the following functions and effects. In the battery state estimation apparatus 1 according to the present embodiment, the followings are performed. The change amount calculation unit 12 calculates the current change amount ΔI and the voltage change amount ΔV of the secondary battery 2 in a predetermined period by using the current values and voltage values of the secondary battery 2 acquired by the electrical information acquisition unit 11 by measurement. Then, the resistance value calculation unit 13 calculates the measured DC resistance value based on the current change amount ΔI and the voltage change amount ΔV. Further, the constant calculation unit 15 calculates the non-temperature dependent constant Ra and the constant A of the temperature dependent function Rb based on the estimated DC resistance value and the measured DC resistance value in the predetermined period. The estimated DC resistance value is expressed by the sum of the non-temperature dependent constant Ra and the temperature dependent function Rb. In this way, the estimated DC resistance value is expressed using both the non-temperature dependent component Ra and the temperature dependent component Rb of the secondary battery 2. The non-temperature dependent constant Ra and the constant A of the temperature dependent function Rb are calculated based on the estimated DC resistance value Rdc', the measured DC resistance value Rdc, and the actual measured temperature T of the secondary battery 2. Thereby, the non-temperature dependent constant Ra and the constant A of the temperature dependent function Rb can be calculated with high accuracy. This makes it possible to estimate the DC resistance value of the secondary battery 2 after deterioration with high accuracy.

In addition, the constant calculation unit 15 calculates the non-temperature dependent constant Ra and the constant A of the temperature dependent function Rb based on the measured DC resistance value that is calculated by the resistance value calculation unit 13 during a measurement period, which is a predetermined period ranging from the start time point to the present time point. As a result, the non-temperature dependent constant Ra and the constant A of the temperature dependent function Rb are calculated using the measured DC resistance values acquired around the present time point. Here, the measured DC resistance value acquired long before the present time point may hinder the estimation with high accuracy in estimating the DC resistance value of the secondary battery 2 around the present time point. Therefore, by performing the above process, it is possible to estimate the DC resistance value of the secondary battery 2 with higher accuracy.

In addition, the constant calculation unit 15 calculates the non-temperature dependent constant Ra and the constant A of the temperature dependent function Rb at the present time point by weighting the multiple calculated past non-temperature dependent constants Ra and the multiple calculated past constants A of the temperature dependent functions Rb according to the time from the present time point. This also makes it possible to estimate the DC resistance value of the secondary battery 2 with higher accuracy.

In addition, the absolute value of the current change amount ΔI acquired by the electrical information acquisition unit 11 is equal to or greater than a predetermined value. Therefore, when the resistance value calculation unit 13 calculates the measured DC resistance value from ΔI and ΔV, it is easy to calculate the measured DC resistance value with high accuracy. On the other hand, if ΔI is too small, it is difficult to calculate the DC resistance value with high accuracy.

In addition, the resistance value calculation unit 13 calculates the measured resistance value using the actually measured current values and actually measured voltage values of the secondary battery 2 acquired by the electrical information acquisition unit 11. That is, when calculating the measured DC resistance value Rdc, the actually measured current values and the actually measured voltage values are used instead of the corrected values such as the current value and voltage value of the secondary battery 2 after the averaging process. Therefore, the measured DC resistance value can be calculated with high accuracy.

As described above, according to the present embodiment, it is possible to provide a battery state estimation apparatus capable of estimating the DC resistance value of the secondary battery after deterioration with high accuracy.

Second Embodiment

Figure 6:
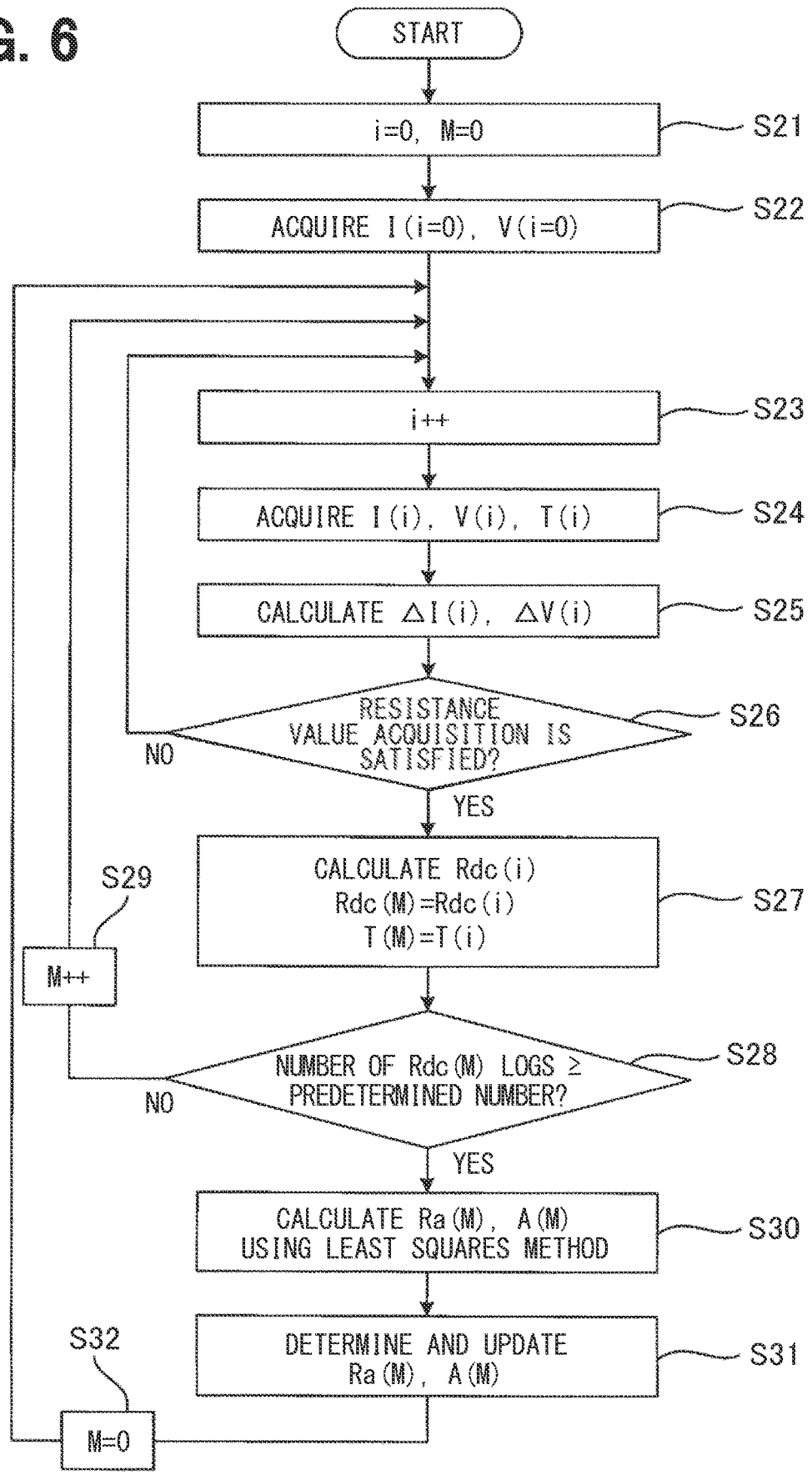
FIG. 6 is a flowchart for explaining a process performed by the battery state estimation apparatus according to a second embodiment.

In a second embodiment, the basic configuration is the same as that in the first embodiment, but as shown in FIG. 6, the processing method for estimating the constants Ra and A by the battery state estimation apparatus 1 is partially changed.

In the present embodiment, first, in step S21, i corresponding to the time axis and M corresponding to the number of times in calculation of Rdc are set to 0 (zero), respectively. Then, in step S22, the current value I(0) and the voltage value V(0), which are initial values of the current value I(i) and the voltage value V(i), are acquired by the measurement by the current sensor 6 and the voltage sensor 5.

Next, in step S23, i is incremented by 1 (one). In step S24, the current value I(1), voltage value V(1), and the value of the temperature T(1) at timing of i=1 are acquired by measurement. The timing of i=1 follows the measurement timing of the current value I(0) and the voltage value V(0) (that is, the timing in step S22). Then, in step S25, ΔI(i) and ΔV(i) are calculated in the same manner as in the first embodiment.

Next, in step S26, it is determined whether or not the resistance value acquisition condition is satisfied, as in the first embodiment. Here, in the present embodiment, when it is determined that the resistance value acquisition condition is not satisfied, the process returns to step S23. Then, when it is determined in step S26 that the resistance value acquisition condition is satisfied, in step S27, the measured DC resistance value Rdc(i)=ΔV(i)/ΔI(i) is calculated from ΔI(i) and ΔV(i) calculated in step S5. Then, Rdc(M)=Rdc(i) and T(M)=T(i) are set, and the logs of Rdc and T are memorized.

Next, in step S28, it is determined whether or not the number of logs of Rdc(M) is equal to or greater than a predetermined number. This predetermined number can be selected to the extent that the least squares method performed in the later step S29 can be performed with high accuracy.

When the number of logs is not greater than a predetermined number in step S28, the logs of Rdc(M) and T(M) up to that point are retained, and M is increased by 1 (one) in step S29 to return to step S23. In contrast, in step S28, when the number of logs is equal to or greater than the predetermined value, the process proceeds to step S30.

In step S30, Ra(M) and A(M) are calculated using the least squares method from the log values of Rdc (M) up to the present time point and the exp(B/T(M)) obtained from the log values of T(M) up to the present time point. For the least squares method, it is possible to use a general method. Then, in step S31, the calculated values are determined respectively as Ra(M) and A(M).

Then, the next estimation of Ra and A is realized by resetting M to 0 in step S32 after step S31 and then performing the process from step S23. Then, in step S31, the values of Ra(M) and A(M) are updated sequentially.

Incidentally, among reference numerals used in the second and subsequent embodiments, the same reference numerals as those used in the embodiment already described represent the same elements as those in the embodiment already described, unless otherwise indicated.

Also in the present embodiment, the similar effects as in the first embodiment are obtained.

The present disclosure is not limited to the respective embodiments described above, and various modifications may be adopted within the scope of the present disclosure without departing from the spirit of the disclosure.

Although the present disclosure has been described in accordance with the embodiments, it should be understood that the present disclosure is not limited to such embodiments or the relevant structures. The present disclosure also includes various modifications and variations within the equivalent scope. In addition, various combinations or modes, and other combinations or modes including one additional element, two or more additional elements, or less elements may also be included within the scope of the category or the technical idea of the present disclosure.

For reference to further explain features of the present disclosure, the description is added as follows.

A secondary battery deteriorates with use; the internal resistance value thus fluctuates. For example, there is disclosed a method of estimating the DC resistance value of a deteriorated secondary battery. This method for estimating the DC resistance value of the secondary battery uses a temperature coefficient that has a temperature dependence according to the Arrhenius equation, to correct the resistance value from the value of the secondary battery in the initial state. The DC resistance value of the deteriorated secondary battery is thereby estimated.

The DC resistance value of a deteriorated secondary battery can also be affected by temperature-independent factors (i.e., non-temperature dependent factors). Therefore, there is room for improvement in the method for estimating the DC resistance value of the secondary battery described in the above from the viewpoint of more accurately estimating the DC resistance value of the deteriorated secondary battery.

It is thus desired for the present disclosure to provide a battery state estimation apparatus capable of estimating the DC resistance value of a deteriorated secondary battery with high accuracy.

An aspect of the present disclosure described herein is set forth in the following clauses.

According to an aspect of the present disclosure, a battery state estimation apparatus is provided to include the followings. An electrical information acquisition unit is configured to acquire a current value and a voltage value of a secondary battery by measurement. A change amount calculation unit is configured to calculate a current change amount ΔI and a voltage change amount ΔV of the secondary battery in a predetermined period using the current value and the voltage value acquired by the electrical information acquisition unit. A resistance value calculation unit is configured to calculate a measured DC resistance value of a DC resistance based on the current change amount ΔI and the voltage change amount ΔV calculated by the change amount calculation unit. A temperature acquisition unit is configured to acquire a temperature of the secondary battery. A constant calculation unit is configured to calculate a non-temperature dependent constant Ra and a constant of a temperature dependent function Rb based on (i) an estimated DC resistance value and (ii) the measured DC resistance value calculated by the resistance value calculation unit. Here, the estimated DC resistance value is an estimated value of the measured DC resistance value in a predetermined period; the estimated DC resistance value is represented as a sum of (i) the non-temperature dependent constant Ra, which indicates a temperature independent component of the DC resistance of the secondary battery, and (ii) the temperature dependent function Rb, which indicates a temperature dependent component of the DC resistance of the secondary battery.

Thus, the battery state estimation apparatus according to the above aspect is provided to express the estimated DC resistance value using both the non-temperature dependent component Ra and the temperature dependent component Rb of the secondary battery, and calculate the non-temperature dependent constant Ra and the constant of the temperature dependent function Rb based on (i) the estimated DC resistance value and (ii) the measured DC resistance value and the actually measured temperature of the secondary battery. Therefore, the non-temperature dependent constant Ra and the constant of the temperature dependent function Rb can be calculated with high accuracy. This makes it possible to estimate the DC resistance value of the deteriorated secondary battery with high accuracy.

As described above, according to the above aspect, it is possible to provide a battery state estimation apparatus that can estimate the DC resistance value of the secondary battery after deterioration with high accuracy.

What is claimed is:

1. A battery state estimation apparatus, comprising:
an electrical information acquisition unit configured to acquire repeatedly a current value and a voltage value of a secondary battery by measurement;
a change amount calculation unit configured to calculate a current change amount and a voltage change amount of the secondary battery, respectively, using the current value and the voltage value acquired by the electrical information acquisition unit;
a resistance value calculation unit configured to calculate a measured DC resistance value of a DC resistance based on the current change amount and the voltage change amount calculated by the change amount calculation unit;
a temperature acquisition unit configured to acquire repeatedly a temperature of the secondary battery;
a constant calculation unit configured to perform a calculation of, as a calculated constant value, (i) a non-temperature dependent constant, which indicates a component of the DC resistance of the secondary battery independent of the temperature, and (ii) a constant of a temperature dependent function, which indicates a component of the DC resistance of the secondary battery dependent on the temperature,
based on (i) the measured DC resistance value calculated by the resistance value calculation unit, and (ii) an estimated DC resistance value being an estimated value of the measured DC resistance value,
the estimated DC resistance value being represented as a sum of (i) the non-temperature dependent constant, and (ii) the temperature dependent function,
wherein the constant calculation unit is configured to perform a plurality of the calculations of a plurality of the non-temperature dependent constants and a plurality of the constants of the temperature dependent functions at corresponding time points in a predetermined period up to a present time point; and
a convergence determination unit configured to determine whether or not the calculated constant value calculated by the constant calculation unit has converged based on a first condition and a second condition,
wherein the first condition is that
a total number of times of the calculations of the non-temperature dependent constants and the constants of the temperature dependent functions is equal to or greater than a predetermined number,
wherein the second condition is that
(i) a slope of an approximate straight line, which is obtained by a plot acquired from (a) the non-temperature dependent constants calculated at the corresponding time points up to the present time point in the predetermined period and (b) the corresponding time points up to the present time point, is equal to or less than a threshold value, and
(ii) a slope of an approximate straight line, which is obtained by a plot acquired from (a) the constants of the temperature dependent functions calculated at the corresponding time points up to the present time point in the predetermined period and (b) the corresponding time points up to the present time point, is equal to or less than a threshold value;
and wherein:
in response to the convergence determination unit determining that the calculated constant value has not converged, the constant calculation unit continues to perform the calculations of the plurality of the non-temperature dependent constants and the plurality of the constants of the temperature dependent functions while retaining logs of the calculated plurality of the non-temperature dependent constants and the calculated plurality of constants of the temperature dependent functions; and in response to the convergence determination unit determining that the calculated constant value has converged, the constant calculation unit determines the non-temperature dependent constant and the constant of the temperature dependent function for use in the calculation of the estimated DC resistance value as the sum of (i) the non-temperature dependent constant and (ii) the temperature dependent function.

2. The battery state estimation apparatus according to claim 1, wherein:
the constant calculation unit is further configured to perform the calculations of the non-temperature dependent constants and the constants of the temperature dependent functions based on a plurality of the measured DC resistance values calculated by the resistance value calculation unit during a measurement period, which is the predetermined period ranging from a start time point to the present time point.

3. The battery state estimation apparatus according to claim 1, wherein:
the constant calculation unit is further configured to perform the calculation of the non-temperature dependent constant at the present time point and the constant of the temperature dependent function at the present time point by
repeatedly performing the calculations of the non-temperature dependent constants and the constants of the temperature dependent functions respectively at the corresponding time points up to the present time point, and
weighting the non-temperature dependent constants and the constants of the temperature dependent functions according to the corresponding time points up to the present time point.

4. The battery state estimation apparatus according to claim 1, wherein:
an absolute value of the current change amount acquired by the electrical information acquisition unit is equal to or greater than a predetermined value.

5. The battery state estimation apparatus according to claim 1, wherein:
the resistance value calculation unit is further configured to perform the calculation of the measured DC resistance value using an actually measured value of the current value and an actually measured value of the voltage value of the secondary battery acquired by the electrical information acquisition unit.

6. A battery state estimation apparatus, comprising:
one or more memories; and
one or more processors communicably coupled with the one or more memories,
the one or more processors being configured to:
acquire repeatedly a temperature, a current value and a voltage value of a secondary battery;
calculate a current change amount and a voltage change amount of the secondary battery, respectively, using the current value and the voltage value;
calculate a measured DC resistance value of a DC resistance based on the current change amount and the voltage change amount;
perform a calculation of, as a calculated constant value, (i) a non-temperature dependent constant, which indicates a temperature independent component of the DC resistance of the secondary battery independent of the temperature, and (ii) a constant of a temperature dependent function, which indicates a component of the DC resistance of the secondary battery dependent on the temperature,
    based on (i) the measured DC resistance value, and (ii) an estimated DC resistance value being an estimated value of the measured DC resistance value,
        the estimated DC resistance value being represented as a sum of (i) the non-temperature dependent constant, and (ii) the temperature dependent function,
  wherein a plurality of the calculations of a plurality of the non-temperature dependent constants and a plurality of the constants of the temperature dependent functions are performed at corresponding time points in a predetermined period up to a present time point; and
determine whether or not the calculated constant value has converged based on a first condition and a second condition,
wherein the first condition is that
  a total number of times of the calculations of the non-temperature dependent constants and the constants of the temperature dependent functions is equal to or greater than a predetermined number,
wherein the second condition is that
  (i) a slope of an approximate straight line, which is obtained by a plot acquired from (a) the non-temperature dependent constants calculated at the corresponding time points up to the present time point in the predetermined period and (b) the corresponding time points up to the present time point, is equal to or less than a threshold value, and
  (ii) a slope of an approximate straight line, which is obtained by a plot acquired from (a) the constants of the temperature dependent functions calculated at the corresponding time points up to the present time point in the predetermined period and (b) the corresponding time points up to the present time point, is equal to or less than a threshold value;
and wherein:
  in response to determining that the calculated constant value has not converged, the one or more processors are further configured to continue to perform the calculations of the plurality of the non-temperature dependent constants and the plurality of the constants of the temperature dependent functions while retaining logs of the calculated plurality of the non-temperature dependent constants and the calculated plurality of constants of the temperature dependent functions; and
  in response to determining that the calculated constant value has converged, the one or more processors are further configured to determine the non-temperature dependent constant and the constant of the temperature dependent function for use in the calculation of the estimated DC resistance value as the sum of (i) the non-temperature dependent constant and (ii) the temperature dependent function.

\* \* \* \* \*